United States Patent
Huang et al.

(10) Patent No.: US 7,256,494 B2
(45) Date of Patent: Aug. 14, 2007

(54) CHIP PACKAGE

(75) Inventors: Cheng-Wei Huang, Kaohsiung (TW); Kuang-Wei Yao, Kaohsiung County (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 11/164,971

(22) Filed: Dec. 13, 2005

(65) Prior Publication Data
US 2006/0226540 A1   Oct. 12, 2006

(30) Foreign Application Priority Data
Apr. 12, 2005   (TW) ................ 94111446 A

(51) Int. Cl.
*H01L 23/34* (2006.01)
(52) U.S. Cl. .............. 257/719; 257/706; 257/707; 257/712; 257/E23.101
(58) Field of Classification Search ........ 257/E23.004, 257/E23.069, E23.084, E23.101, 712, 726, 257/706, 707, 717–720, 727
See application file for complete search history.

(56) References Cited
U.S. PATENT DOCUMENTS

| | | | | |
|---|---|---|---|---|
| 4,868,349 A | * | 9/1989 | Chia | .................. 174/526 |
| 5,045,914 A | * | 9/1991 | Casto et al. | ................. 257/693 |
| 5,609,889 A | * | 3/1997 | Weber | ................ 425/116 |
| 5,673,479 A | * | 10/1997 | Hawthorne | ................. 29/832 |
| 5,734,555 A | * | 3/1998 | McMahon | ................. 361/704 |
| 5,763,939 A | * | 6/1998 | Yamashita | ................. 257/668 |
| 5,819,398 A | * | 10/1998 | Wakefield | .................. 29/830 |
| 6,515,356 B1 | * | 2/2003 | Shin et al. | ................. 257/678 |
| 6,861,747 B2 | * | 3/2005 | Miyazaki et al. | ............. 257/718 |
| 2004/0051172 A1 | * | 3/2004 | Miyazaki et al. | ............. 257/706 |

* cited by examiner

*Primary Examiner*—Kenneth Parker
*Assistant Examiner*—Chris C. Chu
(74) *Attorney, Agent, or Firm*—Jiang Chyun IP Office

(57) ABSTRACT

A chip package including a heat spreader, a circuit substrate, locating structures, a chip, wires, and an encapsulating compound is provided. The heat spreader has a bonding surface, and the circuit substrate is disposed on the bonding surface of the heat spreader. The circuit substrate has an opening, which exposes a portion of the bonding surface. The locating structures are disposed on the heat spreader for fixing the circuit substrate and attaching the circuit substrate to the bonding surface closely. The chip is disposed on the bonding surface exposed by the opening, and the wires are coupled between the chip and the circuit substrate. The encapsulating compound is disposed on the bonding surface exposed by the opening for covering the chip, the wires, and a portion of the circuit substrate. The chip package has high reliability and high yield of processing.

12 Claims, 9 Drawing Sheets

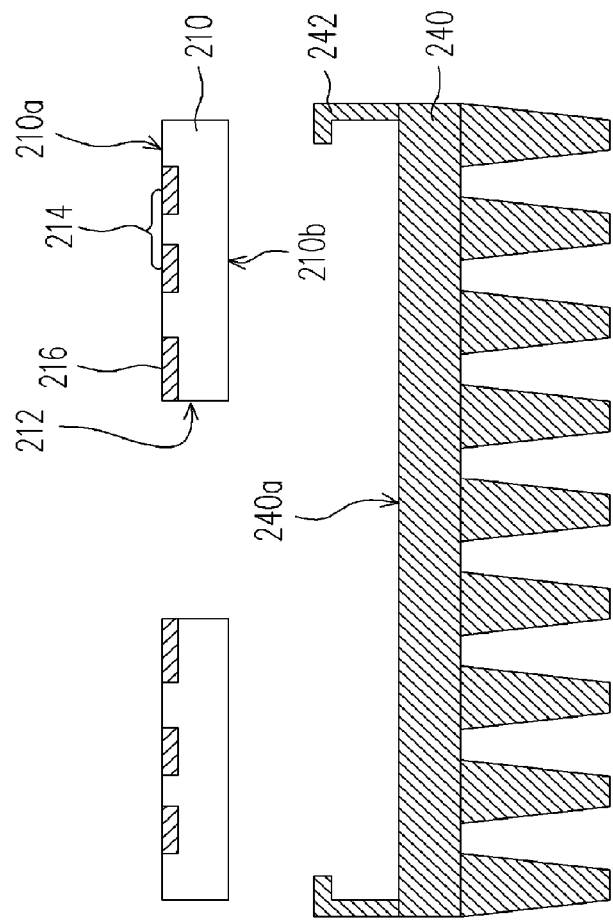
FIG. 3A
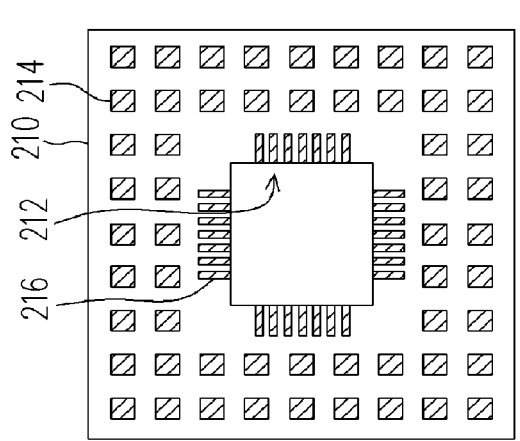
FIG. 2A
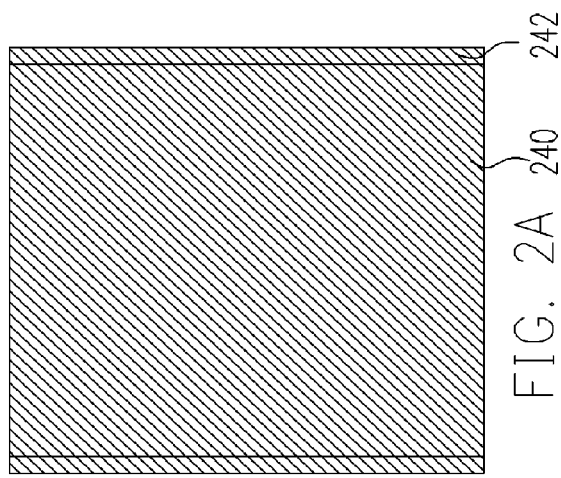

CHIP PACKAGE

CROSS-REFERENCE TO RELATED APPLICATION

This application claims the priority benefit of Taiwan application serial no. 94111 446, filed on Apr. 12, 2005. All disclosure of the Taiwan application is incorporated herein by reference.

BACKGROUND OF THE INVENTION

1. Field of Invention

The present invention relates to a semiconductor device. More particularly, the present invention relates to a chip package.

2. Description of Related Art

Recently, with the continuous improvement of the integration of the internal circuit of the integrated circuit (IC) chip, the heat produced by the chip is also increased continuously. For the personal computer, IC chips with high integration, such as the Central Processing Unit or drawing chip, produce a great deal of heat. To allow said IC chip to continue normal operation, the IC chip must be kept under a preferable operating temperature in order to avoid degradation of the performance or damage due to overheating. In other words, with the continuous improvement of the processing speed and the data processing capacity of the IC chip, the heat radiating requirements are also enhanced relatively.

On the other hand, along with the development trend of the semiconductor device towards light, thin, short, and small, a package structure has been developed wherein a cavity is formed on a carrier for accommodating a chip, so as to reduce the profile of the package structure and improve its heat radiating effect and electrical properties.

FIG. 1 is a schematic sectional view of a conventional chip package with a heat spreader. With reference to FIG. 1, the chip package 100 comprises a circuit substrate 110, a chip 120, wires 130, a heat spreader 140, and an encapsulating compound 150. The circuit substrate 110 is disposed on a bonding surface 140a of the heat spreader 140 and has an opening 112 for exposing a portion of the bonding surface 140a. The cavity for accommodating the chip 120 is formed from the opening 112 of the circuit substrate 110 and the bonding surface 140a of the heat spreader 140. The chip 120 is disposed on the bonding surface 140a exposed by the opening 112 and coupled to the contacts on the substrate 110 through a plurality of wires 130.

With reference to FIG. 1 again, the encapsulating compound 150 is disposed on the bonding surface 140a exposed by the opening 120 and covers the chip 120, the wires 130, and a portion of the circuit substrate 110. Moreover, a plurality of solder balls 160 is disposed on the ball pads of the circuit substrate 110 for coupling the chip package 110 to the outside. As described above, a great deal of heat is produced by the chip 120 and the circuit substrate 110 when the chip package 110 is in the state of general operation. Then, the heat is transferred to the heat spreader 140 to achieve the goal of heat radiation.

It should be noted that conventionally the circuit substrate 110 is attached to the heat spreader 140 by direct adhesion, i.e., an adhesion layer 170 is formed between the circuit substrate 110 and the heat spreader 140 for fixing the circuit substrate 110 on the heat spreader 140. However, the circuit substrate 110 is easily warped due to the ambient temperature during processing or during use, so that the circuit substrate 110 cannot be attached to the bonding surface 140a of the heat spreader 140 effectively. Thus, this leads not only to a reduction in the effectiveness of heat radiation for the chip package 100 and lower reliability, but further results in difficulty with the subsequent wire bond or ball mount, thereby affecting the yield of processing.

SUMMARY OF THE INVENTION

Accordingly, an object of the present invention is to provide a chip package, in which the circuit substrate is directly attached to the heat spreader through a locating structure, thus achieving superior heat radiating capability and high reliability.

Based on the above or other objects, the invention provides a chip package, which mainly comprises a heat spreader, a circuit substrate, a plurality of locating structures, a chip, a plurality of wires, and an encapsulating compound. The heat spreader has a bonding surface, and the circuit substrate is disposed on the bonding surface of the heat spreader. The circuit substrate has an opening for exposing a portion of the bonding surface. Furthermore, the locating structures are disposed on the heat spreader for fixing the circuit substrate and attaching the circuit substrate to the bonding surface closely, wherein the locating structures includes a plurality of edge folds located on the opposite sides of the bonding surface, and a portion of the edge of the circuit substrate is locked in the edge folds. The chip is disposed on the bonding surface exposed by the opening, and the wires are coupled between the chip and the circuit substrate. Additionally, the encapsulating compound is disposed on the bonding surface exposed by the opening for covering the chip, the wires, and a portion of the circuit substrate.

In one preferred embodiment of the invention, the locating structures further comprise, for example, a plurality of locating pins disposed on the bonding surface, and the circuit substrate has a plurality of locating holes corresponding to the locating pins.

In one preferred embodiment of the invention, the chip package further comprises, for example, a plurality of solder balls disposed on the surface of the circuit substrate far away from the heat spreader.

In one preferred embodiment of the invention, the chip package further comprises, for example, an adhesive disposed between the chip and the bonding surface. Moreover, the adhesive can be further disposed between the edge of the circuit substrate and the bonding surface.

According to the invention, because the locating structures are disposed on the heat spreader for fixing the circuit substrate on the heat spreader, the circuit substrate is protected from distortion, avoiding problems in the subsequent process. Furthermore, since the circuit substrate of the invention is attached to the heat spreader closely, superior heat radiating capability and high reliability of the chip package can be achieved.

In order to the make the aforementioned and other objects, features and advantages of the present invention comprehensible, preferred embodiments accompanied with Figures are described in detail below.

BRIEF DESCRIPTION OF THE DRAWINGS

FIGS. 2A-2G are top schematic views of a chip packaging process in sequence according to one preferred embodiment of the invention;

FIG. 3A-3G are sectional views of the FIGS. 2A-2G in sequence; and

DESCRIPTION OF EMBODIMENTS

Figure 1:
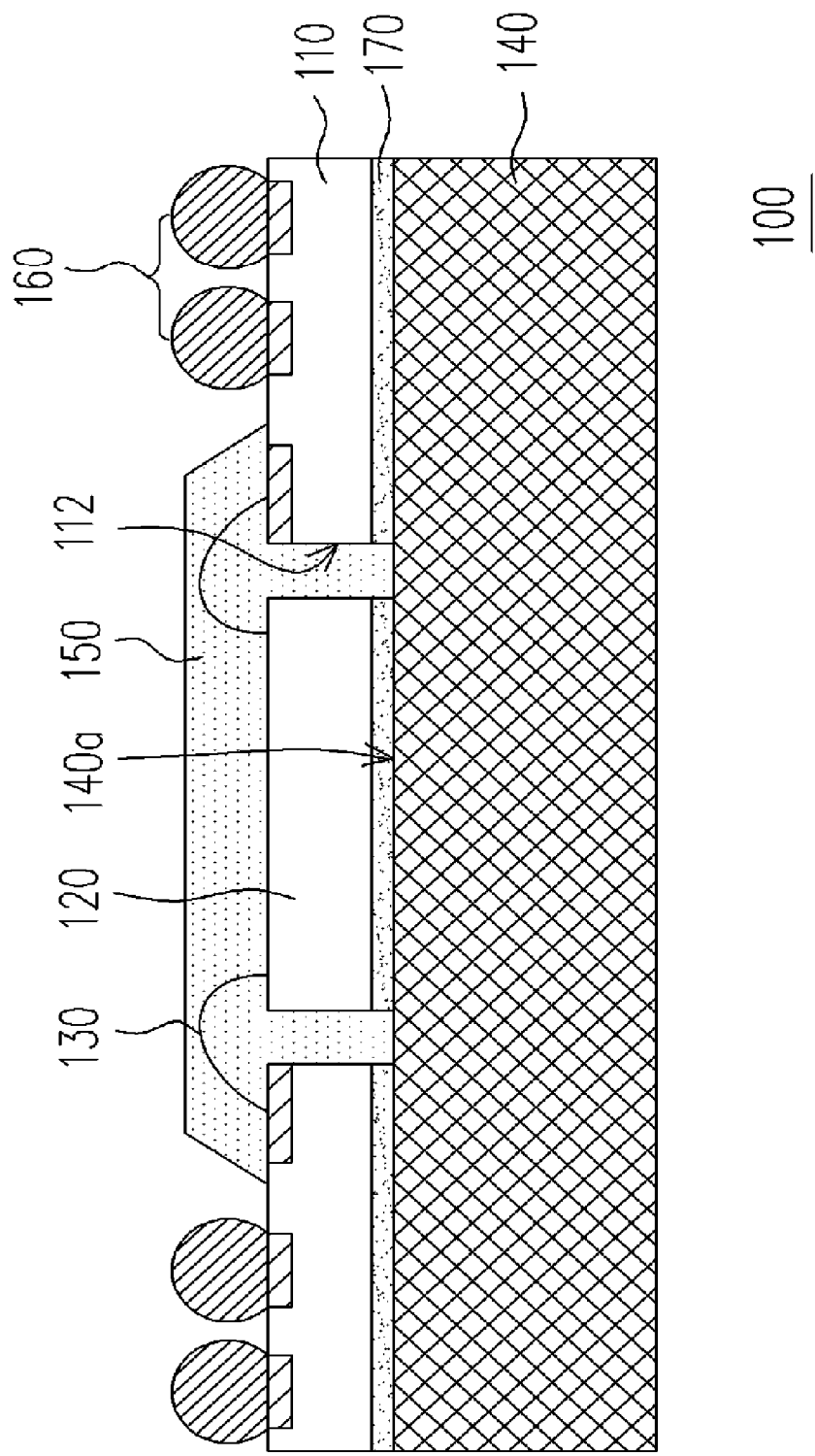
FIG. 1 is a schematic sectional view of the conventional chip package with a heat spreader.

FIGS. 2A-2G are top schematic views of a chip packaging process in sequence according to one preferred embodiment of the invention, and FIGS. 3A-3G are sectional views of FIGS. 2A-2G in sequence.

Firstly, as shown in FIGS. 2A and 3A, a circuit substrate 210 and a heat spreader 240 are provided. The heat spreader has a bonding surface 240a, and a plurality of locating structures is disposed on the heat spreader 240. In the embodiment, the locating structures are, for example, edge folds 242 formed on opposite sides of the heat spreader 240. Furthermore, the circuit substrate 210 has two opposite surfaces, a first surface 210a and a second surface 210b, and an opening 212. A plurality of ball pads 214 is disposed, for example, on the periphery of the first surface 210a of the circuit substrate 210, and a plurality of contacts 216, for example, finger contacts or contacts with other shapes, is disposed on the first surface 210a adjacent to the opening 212.

Figure 3B:
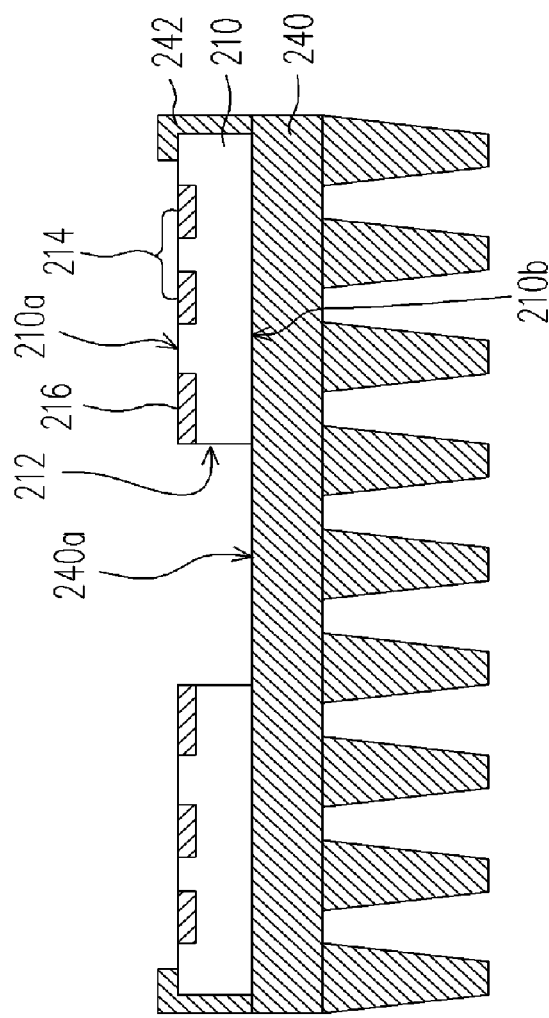
Figure 2B:
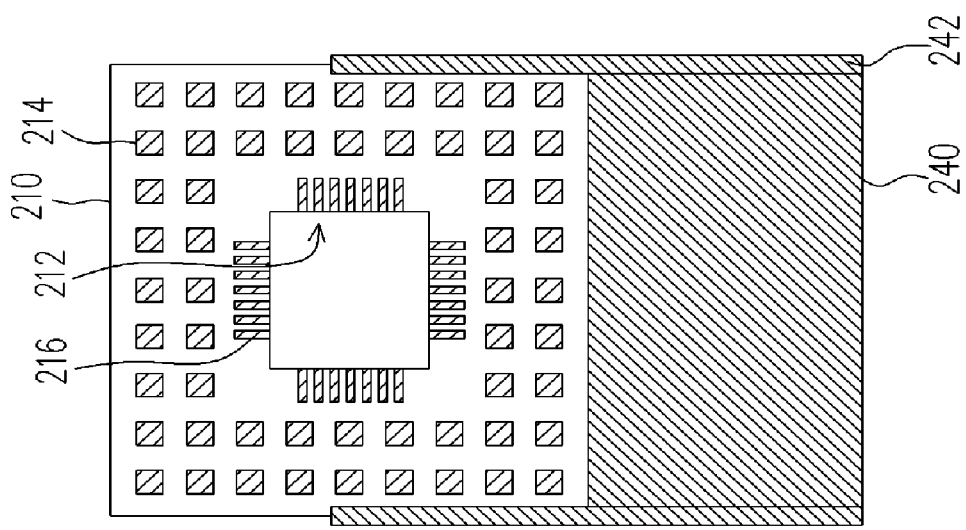

Then, as shown in FIGS. 2B and 3B, the second surface 210b of the circuit substrate 210 is disposed facing to the bonding surface 240a, and the circuit substrate 210 is fixed on the heat spreader 240 through the locating structures. In the embodiment, the locating structures are, for example, the edge folds 242 on both sides of the heat spreader 240. Therefore, the method of arranging the circuit substrate 210 is, for example, to shift the circuit substrate 210 along the bonding surface 240a from the outside of the heat spreader 240, so that a portion of the edge of the circuit substrate 210 enters and is locked within the edge folds 242. As such, the circuit substrate 210 is attached on the bonding surface 240a of the heat spreader 240 by the edge folds 242, and the opening 212 of the circuit substrate 210 exposes a portion of the bonding surface 240a.

Figure 3C:
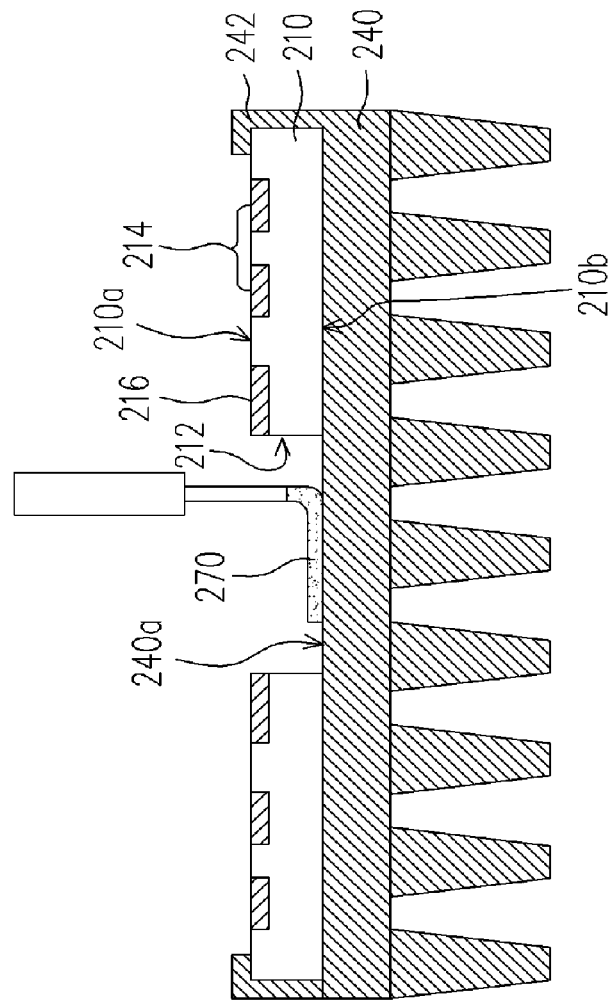
Figure 2C:
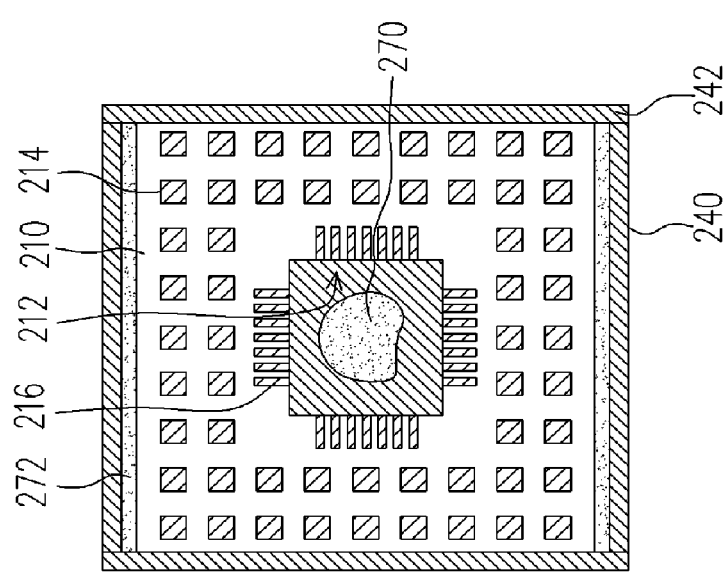

Then, with reference to FIGS. 2C and 3C, an adhesive 270 is formed on the bonding surface 240a exposed by the opening 212 of the circuit substrate 210. Furthermore, an adhesive 272 can be formed between the edge of the circuit substrate 210 and the bonding surface 240a in the same way, so as to further fix the circuit substrate 210 on the heat spreader 240.

Figure 3D:
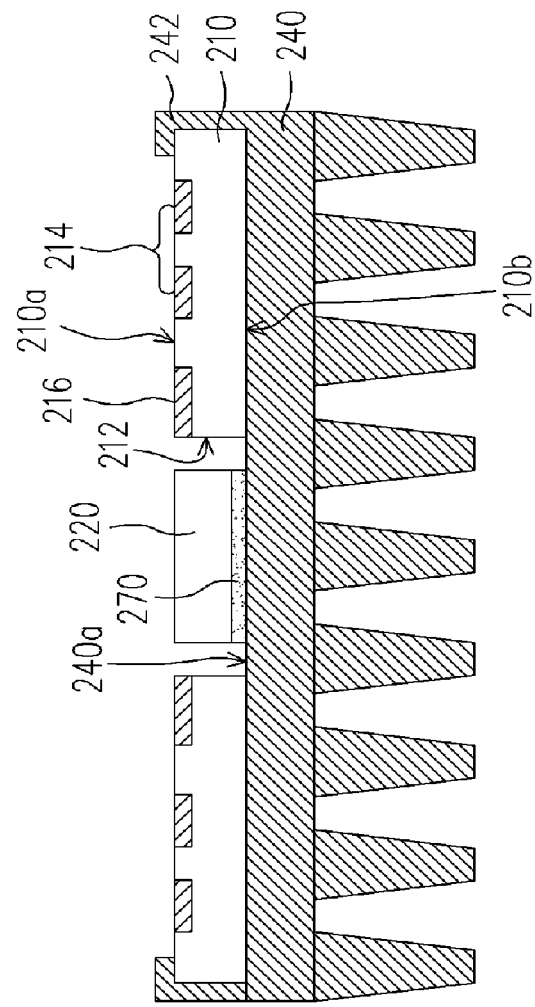
Figure 2D:
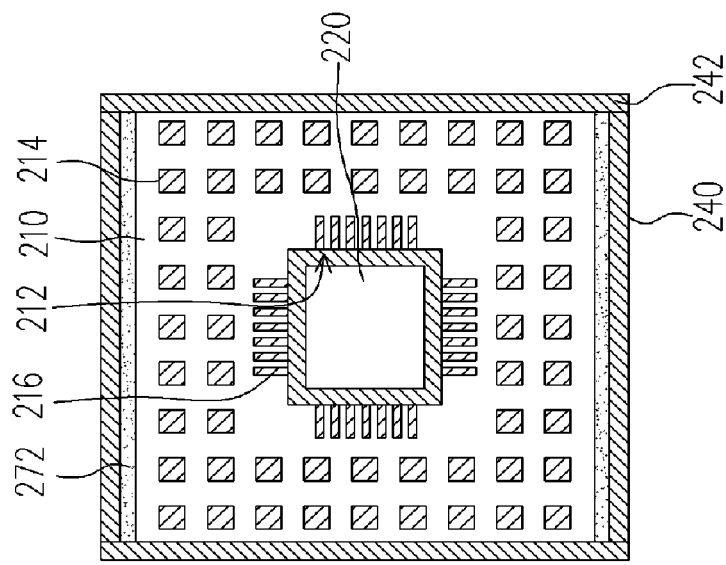

Next, as shown in FIGS. 2D and 3D, the chip 220 is arranged on the bonding surface 240a exposed by the opening 212, and the adhesives 270 and 272 are cured. Thereby, the chip 220 is attached to the bonding surface 240a by the adhesive 270, and the adhesive 272 on both sides of the circuit substrate 210 helps to fix the circuit substrate 210 on the bonding surface 240a.

Figure 3E:
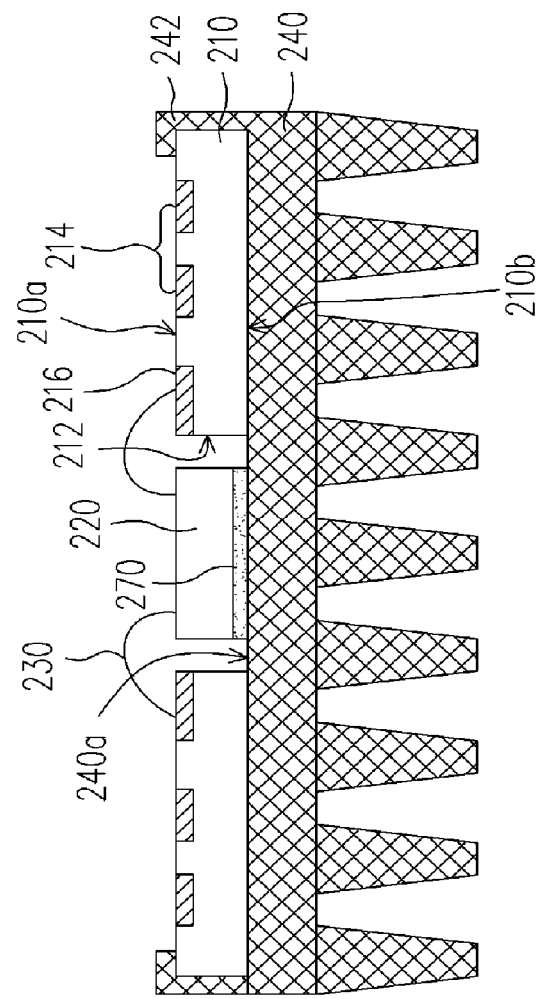
Figure 2E:
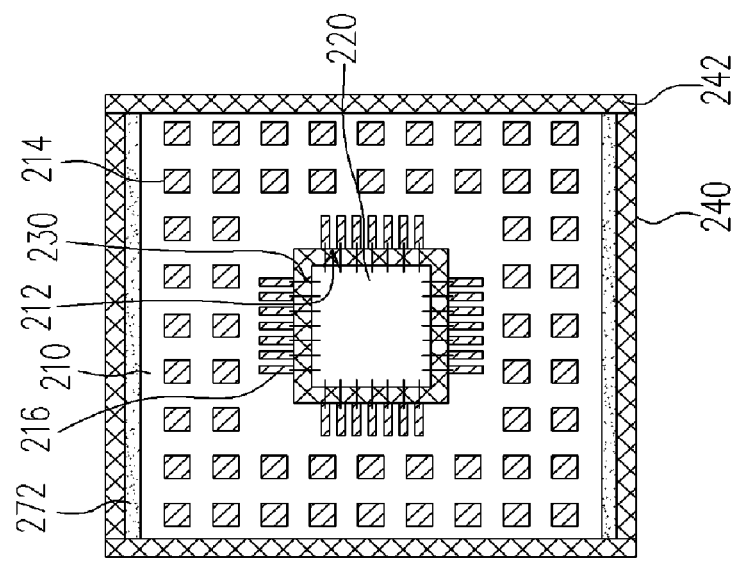

Subsequently, as shown in FIGS. 2E and 3E, a process of wire bond is carried out, and then the chip 220 is coupled to the contacts 216 on the circuit substrate 210 through a plurality of wires 230.

Figure 3F:
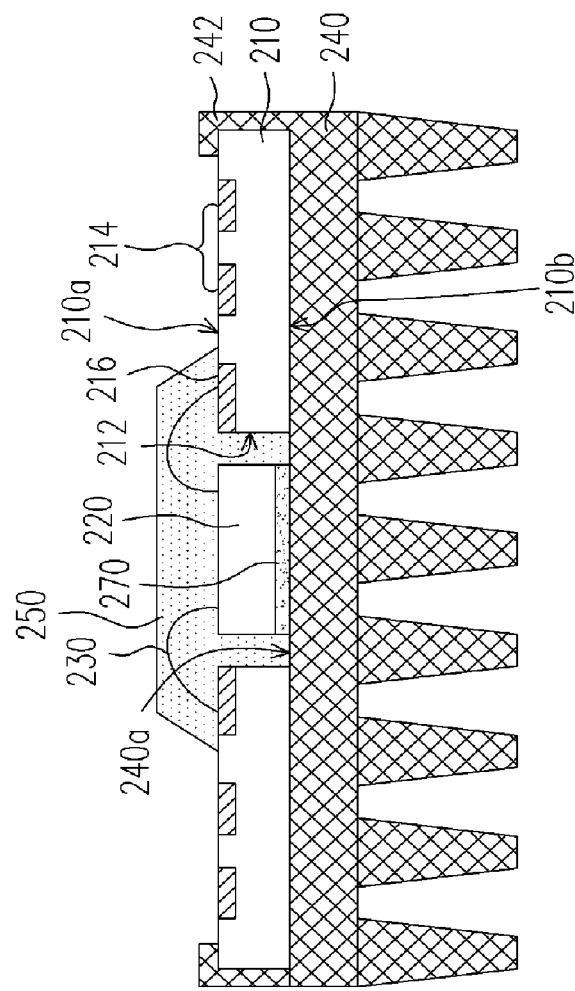
Figure 2F:
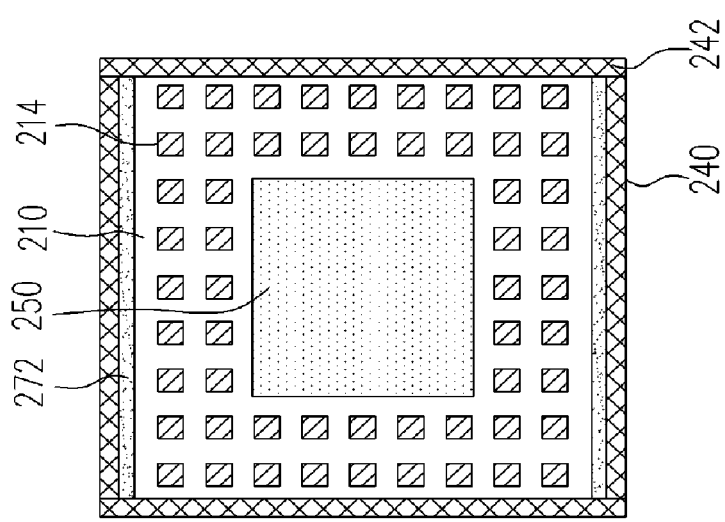

Then, as shown in FIGS. 2F and 3F, an encapsulating compound 250 is formed on the bonding surface 240a exposed by the opening 212 of the circuit substrate 210. The encapsulating compound 250 at least covers the chip 220, the wires 230, and the contacts 216 on the circuit substrate 210 to protect the same.

Figure 3G:
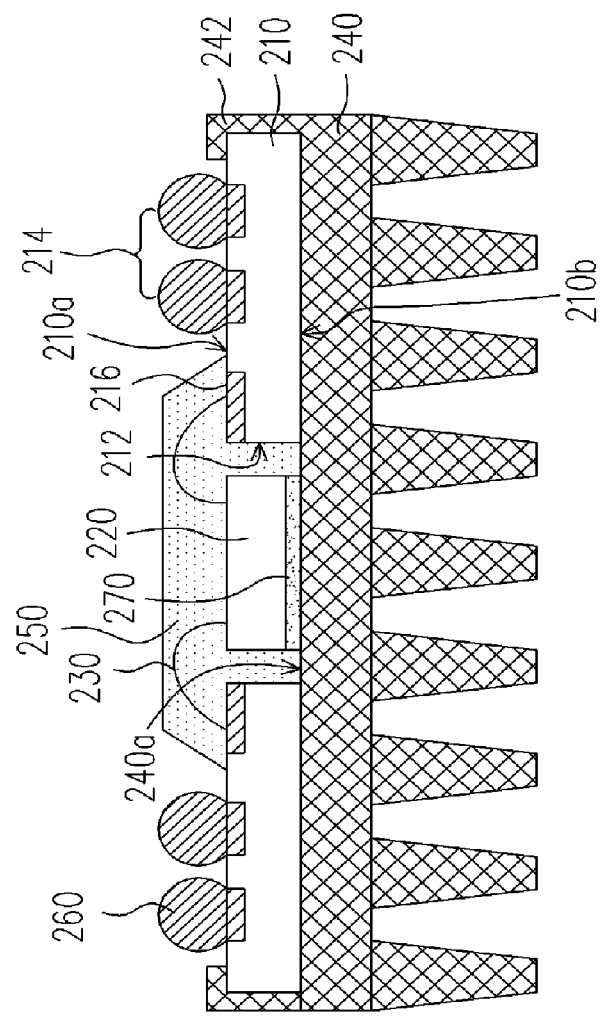
Figure 2G:
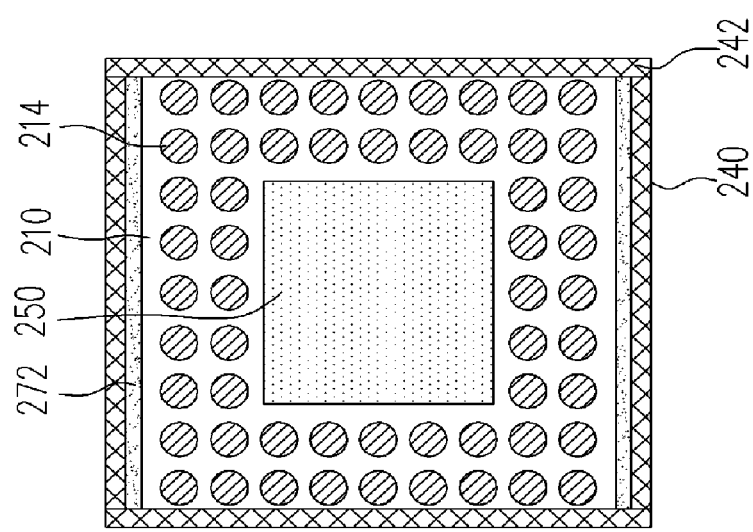

A chip package 200 of the invention is more or less complete after finishing the above steps. After that, as shown in FIGS. 2G and 3G, a plurality of solder balls 260 are further formed on the ball pads 214 on the first surface 210a of the circuit substrate 210, in order to couple the chip package 200 to the external circuits. The chip package 200 can be coupled to the external circuits successfully only when the solder ball 260 is higher than the encapsulating compound 250.

In the aforementioned embodiments, the edge folds are formed on both sides of the heat spreader for fixing the circuit substrate on the heat spreader and simplifying the steps of attaching the circuit substrate to the heat spreader. Of course, besides the above embodiments, other locating structures can be used to fix the circuit substrate in the invention. Another embodiment is described blow, in which the circuit substrate is fixed by another locating structure.

Figures 4A, 4B:
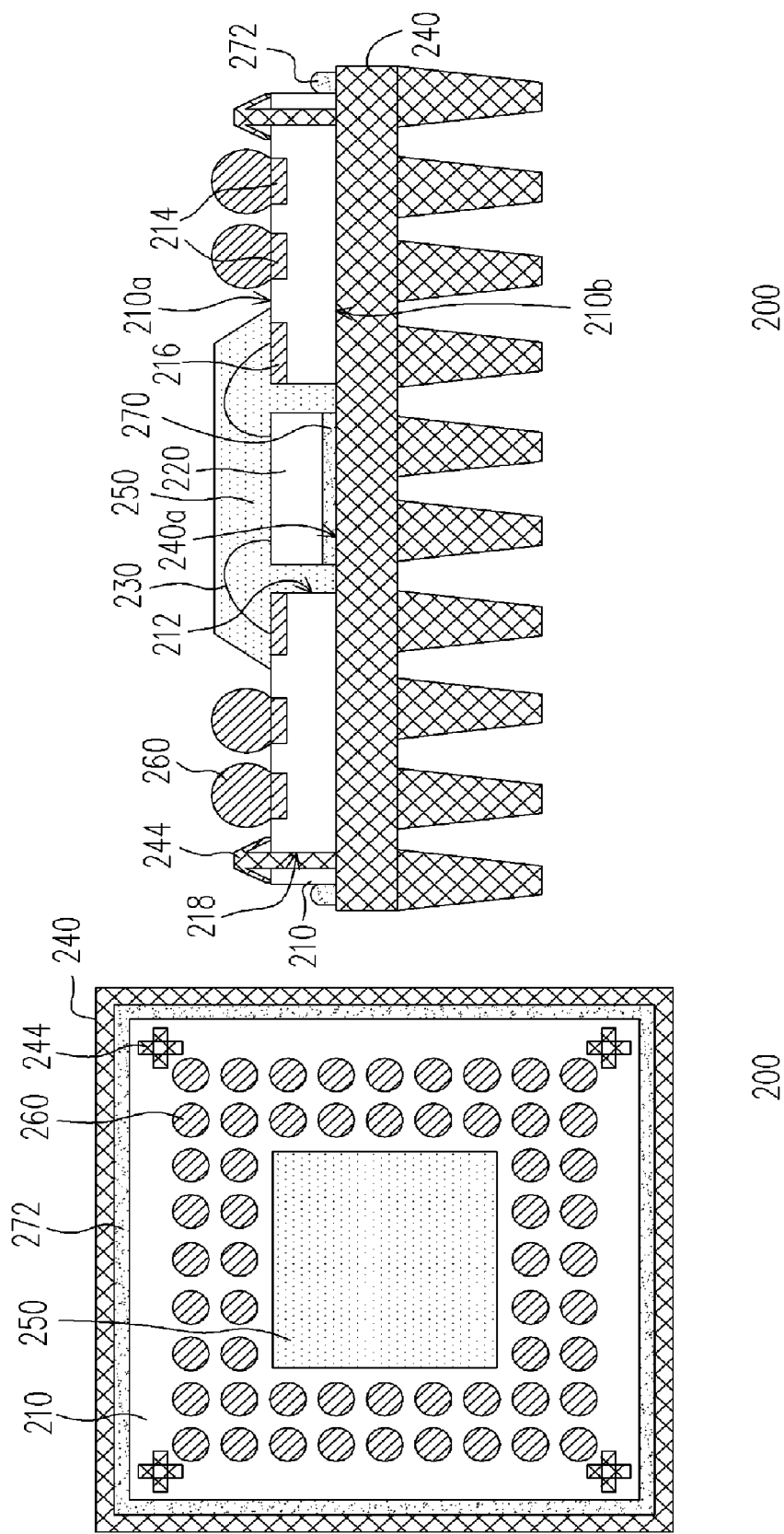
FIGS. 4A and 4B are a top schematic view and a sectional view, respectively, of another chip package according to one preferred embodiment of the invention.

FIGS. 4A and 4B are a top schematic view and a sectional view, respectively, of another chip package according to one preferred embodiment of the invention. The same reference numbers in FIGS. 4A and 4B refer to the same elements, and the descriptions of the elements are described above and will be omitted herein. As shown in FIGS. 4A and 4B, the locating pins 244 are disposed, for example, on the four corners of the heat spreader 240 respectively, and the circuit substrate 210 has, for example, a plurality of locating holes 218 corresponding to the locating pins 244. The circuit substrate 210 is fixed on the bonding surface 240a of the heat spreader 240 by aligning the locating holes 218 of the circuit substrate 210 with the locating pins 244 on the heat spreader 240 and passing the locating pins 244 through the locating holes 218.

Moreover, with reference to FIGS. 4A and 4B again, after the circuit substrate 210 is fixed on the bonding surface 240a of the heat spreader 240, for example, an adhesive 272 is formed on the joint of the edge of the circuit substrate 210 and the bonding surface 240a, in order to enhance the bond between the circuit substrate 210 and the heat spreader 240.

It should be noted that though the features of the invention are illustrated by different locating structures such as edge folds and locating pins in the aforementioned embodiments, in fact, possible locating structures are not limited to those described in the aforementioned embodiments. It is known to those skilled in the art that the circuit substrate can be fixed on the heat spreader by equivalent structures in practice, according to the aforementioned embodiments.

As described above, the heat spreader of the chip package of the invention is provided with locating structures for fixing the circuit substrate. Compared with the conventional method, in which an adhesion layer is used to attach the circuit substrate to the heat spreader, the locating structures in the invention can simplify bonding steps and fix the circuit substrate to the heat spreader effectively. Therefore, according to the invention, the circuit substrate can be protected from distortion, avoiding problems during the subsequent process, thereby enhancing the yield of processing. Furthermore, since the circuit substrate is attached to the heat spreader closely according to the invention, superior heat radiating capability and high reliability of the chip package can be achieved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip package, comprising:
a heat spreader having a bonding surface;
a circuit substrate disposed on the bonding surface of the heat spreader and having an opening exposing a portion of the bonding surface;
a plurality of locating structures disposed on the heat spreader for fixing the circuit substrate and attaching the circuit substrate to the bonding surface closely, wherein the locating structures comprise a plurality of edge folds on the opposite sides of the bonding surface, and the edges of the circuit substrate corresponding to the edge folds are fully covered by the edge folds and are locked in the edge folds;
a chip disposed on the bonding surface exposed by the opening;
a plurality of wires coupled between the chip and the circuit substrate; and
an encapsulating compound disposed on the bonding surface exposed by the opening and covering the chip, the wires and a portion of the circuit substrate.

2. The chip package as claimed in claim 1, wherein the locating structures further comprise a plurality of locating pins disposed on the bonding surface, and the circuit substrate has a plurality of locating holes corresponding to the locating pins.

3. The chip package as claimed in claim 1, further comprising a plurality of solder balls disposed on the surface of the circuit substrate far away from the heat spreader.

4. The chip package as claimed in claim 1, further comprising an adhesive disposed between the chip and the bonding surface.

5. The chip package as claimed in claim 4, wherein the adhesive is further disposed between the edge of the circuit substrate and the bonding surface.

6. The chip package as claimed in claim 1, wherein the edge folds are located on one pair of the opposite sides of the bonding surface respectively.

7. A chip package, comprising:
a heat spreader having a bonding surface;
a circuit substrate disposed on the bonding surface of the heat spreader and having an opening exposing a portion of the bonding surface;
a plurality of locating structures disposed on the heat spreader for fixing the circuit substrate and attaching the circuit substrate to the bonding surface closely, wherein the locating structures comprise a plurality of edge folds on the opposite sides of the bonding surface, and the heat spreader and each of the edge folds form a track space for further locking the corresponding edge of the circuit substrate therein;
a chip disposed on the bonding surface exposed by the opening;
a plurality of wires coupled between the chip and the circuit substrate; and
an encapsulating compound disposed on the bonding surface exposed by the opening and covering the chip, the wires and a portion of the circuit substrate.

8. The chip package as claimed in claim 7, wherein the locating structures farther comprise a plurality of locating pins disposed on the bonding surface, and the circuit substrate has a plurality of locating holes corresponding to the locating pins.

9. The chip package as claimed in claim 7, further comprising a plurality of solder balls disposed on the surface of the circuit substrate far away from the heat spreader.

10. The chip package as claimed in claim 7, further comprising an adhesive disposed between the chip and the bonding surface.

11. The chip package as claimed in claim 10, wherein the adhesive is further disposed between the edge of the circuit substrate and the bonding surface.

12. The chip package as claimed in claim 7, wherein the edge folds are located on one pair of the apposite sides of the bonding surface respectively.

* * * * *